United States Patent
Joo et al.

(10) Patent No.: US 9,286,157 B2
(45) Date of Patent: *Mar. 15, 2016

(54) ADDRESS DETECTION CIRCUIT AND MEMORY INCLUDING THE SAME

(71) Applicant: SK hynix Inc., Gyeonggi-do (KR)

(72) Inventors: Min-Ho Joo, Gyeonggi-do (KR); Ki-Chang Kwean, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 186 days.

This patent is subject to a terminal disclaimer.

(21) Appl. No.: 14/142,408

(22) Filed: Dec. 27, 2013

(65) Prior Publication Data

US 2015/0089326 A1 Mar. 26, 2015

(30) Foreign Application Priority Data

Sep. 25, 2013 (KR) .......................... 10-2013-0113882

(51) Int. Cl.
*G11C 29/00* (2006.01)
*G06F 11/10* (2006.01)

(52) U.S. Cl.
CPC .................................. *G06F 11/1016* (2013.01)

(58) Field of Classification Search
CPC .. G11C 11/406; G11C 8/04; G11C 11/40611; G11C 29/783; G11C 11/4087; G11C 7/02; G11C 11/4085; G11C 11/404; G06F 11/1016
See application file for complete search history.

(56) References Cited

U.S. PATENT DOCUMENTS

| | | | |
|---|---|---|---|
| 6,421,789 B1* | 7/2002 | Ooishi | 714/6.32 |
| 2009/0177845 A1* | 7/2009 | Moyer et al. | 711/146 |
| 2013/0100754 A1 | 4/2013 | Asaoka et al. | |
| 2015/0179242 A1* | 6/2015 | Chi et al. | 365/222 |

FOREIGN PATENT DOCUMENTS

| | | |
|---|---|---|
| KR | 1020050011823 | 1/2005 |
| KR | 1020060054822 | 5/2006 |
| KR | 1020110074285 | 6/2011 |
| KR | 1020140139848 | 12/2014 |

* cited by examiner

Primary Examiner — Guerrier Merant
(74) Attorney, Agent, or Firm — IP & T Group LLP

(57) ABSTRACT

An address detection circuit comprises first to N-th address storage units suitable for storing an address, first to N-th calculation units each suitable for performing a counting operation when an address is stored in a corresponding address storage unit among the address storage units or the address stored in the corresponding address storage unit is inputted, a control unit suitable for sequentially storing an input address in the address storage units, and storing the input address in a selected address storage unit among the address storage units when of the address storage units each store an address, and a detection unit suitable for detecting an address, which is inputted a reference number of times or more, among the addresses stored in the address storage units, based on outputs of the calculation units.

19 Claims, 10 Drawing Sheets

ADDRESS DETECTION CIRCUIT AND MEMORY INCLUDING THE SAME

CROSS-REFERENCE TO RELATED APPLICATIONS

The present application claims priority of Korean Patent Application No. 10-2013-0113882, filed on Sep. 25, 2013, which is incorporated herein by reference in its entirety.

BACKGROUND

1. Field

Exemplary embodiments of the present invention relate to semiconductor design technology, and more particularly, to an address detection circuit, a memory, and a memory system.

2. Description of the Related Art

As the degree of integration of memories increase, a space between word lines included in a memory, such as dynamic random-access memory "DRAM", is decreased. Due to the decreased space between the word lines, a coupling effect between adjacent word lines increases. Thus, when a specific word line of the memory is activated an excessive large number of times or activated frequently between refresh operations, data of memory cells connected to a word line adjacent to the specific word line may be degraded. Such a phenomenon is referred to as word line disturbance or row hammer. Due to the word line disturbance, the data of the memory cells may be degraded even within a retention time of the memory cells to be refreshed FIG. 1 is a diagram illustrating a part of a cell array included in a memory for describing the word line disturbance.

In FIG. 1, BL and BL+1 represent bit lines, and WLK−1, WLK, and WLK+1 represent three word lines disposed sequentially within the cell array. Among the word lines WLK−1, WLK, and WLK+1, WLK with "HIGH_ACT" corresponds to a frequently activated word line, a high active word line or a word line having the large number of activations, that is activated at a high frequency, and WLK−1 and WLK+1 correspond to adjacent word lines, which are disposed adjacent to the frequently activated word line WLK. Furthermore, CELL_K−1, CELL_K, and CELL_K+1 represent memory cells connected to the word lines WLK−1, WLK, and WLK+1, respectively. The memory cells CELL_K−1, CELL_K, and CELL_K+1 include cell transistors TR_K−1, TR_K, and TR_K+1 and cell capacitors CAP_K−1, CAP_K, and CAP_K+1, respectively.

When the frequently activated word line WLK is activated or precharged i.e., deactivated, the voltages of the adjacent word lines WLK−1 and WLK+1 increase or decrease due to a coupling effect occurring between the frequently activated word line WLK and the adjacent word lines WLK−1 and WLK+1. Accordingly, the amount of charges charged in the cell capacitors CAP_K−1 and CAP_K+1 is affected, so that the data stored in the memory cells CELL_K−1 and CELL_K+1 may be degraded.

Furthermore, electromagnetic waves generated while the word line toggles between the active state and the precharge state introduce or discharge electrons into or from the cell capacitors included in the memory cells connected to adjacent word lines, thereby degrading the data of the memory cells

SUMMARY

Various embodiments of the present invention are directed to an address detection circuit, which may reduce a circuit area by minimizing the number of addresses stored to detect a frequently activated word line, and a memory and a memory system.

Other embodiments of the present invention are directed to an address detection circuit, which may refresh adjacent word lines disposed adjacent to a frequently activated word line, thereby preventing the degradation of data due to word line disturbance, and a memory and a memory system.

In an embodiment of the present invention, an address detection circuit may include first to N-th address storage units suitable for storing an address, first to N-th calculation units each suitable for performing a counting operation when an address is stored in a corresponding address storage unit among the address storage units or the address stored in the corresponding address storage unit is inputted, a control unit suitable for sequentially storing an input address in the address storage units, and storing the input address in a selected address storage unit among the address storage units when all of the address storage units each store an address, and a detection unit suitable for detecting an address, which is inputted a reference number of times or more, among the addresses stored in the address storage units, based on outputs of the calculation units.

In an embodiment of the present invention, a memory may include first to N-th word lines each connected to one or more memory cells, an address detection unit including first to N-th address storage units, and suitable for sequentially storing an input address in the address storage units during an active operation, generating first to N-th calculated values by performing a counting operating when an address is stored in the address storage units or the stored address is inputted, and storing an input address in a selected address storage unit when all of the address storage units each store an address, and detecting an address, which is inputted a reference number of times or more based on the calculated values, and a control unit suitable for sequentially refreshing the word lines in response to a refresh command inputted at a set period, and refreshing one or more word lines adjacent to a word line corresponding to an address detected by the address detection unit in response to the refresh command, when the address is detected by the address detection unit.

In an embodiment of the present invention, a memory system may include a memory including first to N-th word lines each connected to one or more memory cells, and suitable for storing and activating a word line corresponding to an input address among the word lines during an active operation, sequentially refreshing the word lines during a refresh operation, and refreshing a word line selected by the input address during a target refresh operation, an address detection circuit including first to N-th address storage units, and suitable for sequentially storing an input address in the address storage units during an active operation, generating first to N-th calculated values by counting when an address is stored in the address storage units or the stored address is inputted, storing an input address in a selected address storage unit when all of the address storage units each store an address, and detecting an address, which is inputted a reference number of times or more based on the calculated values, and a memory controller suitable for transmitting an active command to the memory during the active operation, transmitting a refresh command to the memory during the refresh operation, and transmitting the active command, a precharge command, and the detected address to the memory during the target refresh operation.

N may be equal to or more than a value obtained by dividing the total number of active operations performed during a set period by the reference number.

The address detection circuit may be included in the memory or the memory controller.

When all of the address storage units each store an address and an address different from the addresses stored in the address storage units is inputted, the address detection circuit subtracts a minimum calculated value from the calculated values where the minimum calculated value is the minimum value among the calculated values, generates a cumulative value by accumulating the minimum calculated value, selects an address storage unit corresponding to the smallest calculated value among the calculated values, and the address detection circuit detects an address stored in an address storage unit in which the sum of a corresponding calculated value and the cumulative value is equal to or more than a reference value corresponding to the reference number, among the address storage units.

When all of the address storage units each store an address, the address detection circuit subtracts a unit value from the calculated values, subtracts the unit value from a stored value therein, when a of the address storage units each store an address, wherein a initial value of the stored value is a reference value corresponding to the reference number, selects an address storage unit corresponding to a calculated value equal to an initial value among the address storage units, and the address detection circuit detects an address stored in an address storage unit corresponding to a calculated value equal to or more than the stored value, among the address storage units.

The address detection circuit generates a total input value corresponding to the total number of input addresses, and when all of the address storage units each store an address, the address detection circuit subtracts a unit value from the calculated values, generates a reference value obtained by subtracting a cumulative value of the unit value from a value obtained by dividing the total input value by a set value, selects an address storage unit corresponding to a calculated value equal to an initial value among the address storage units, and detects an address stored in an address storage unit corresponding to a calculated value equal to or more than the reference value among the address storage units.

DETAILED DESCRIPTION

Figure 1:
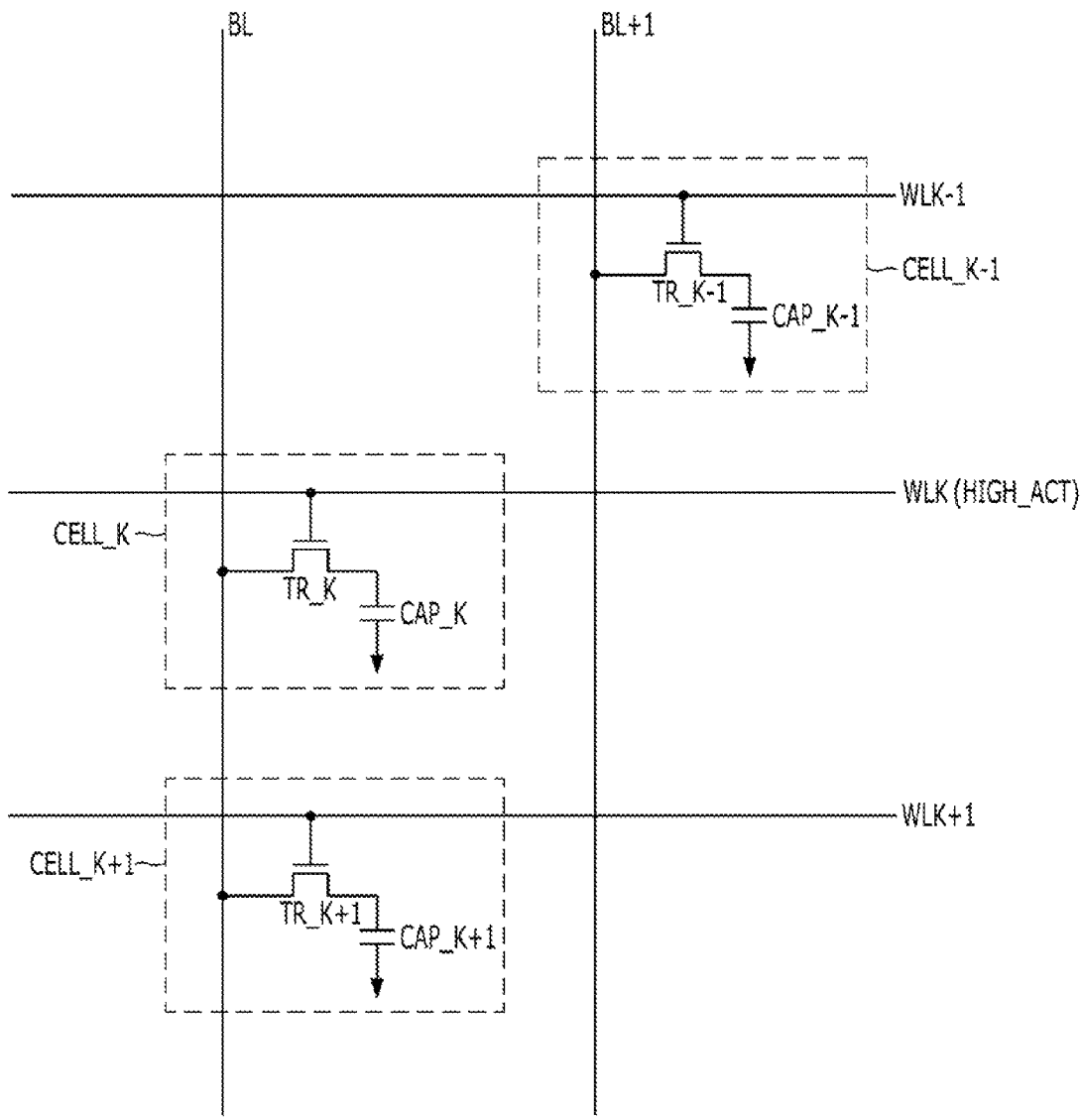
FIG. 1 is a diagram illustrating a part of a cell array included in a memory for describing word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In the following descriptions, a frequently activated word line or a target row may indicate a word line of which the active number satisfies a set condition, and a frequent input address may indicate an address corresponding to the frequently activated word line.

Figure 2:
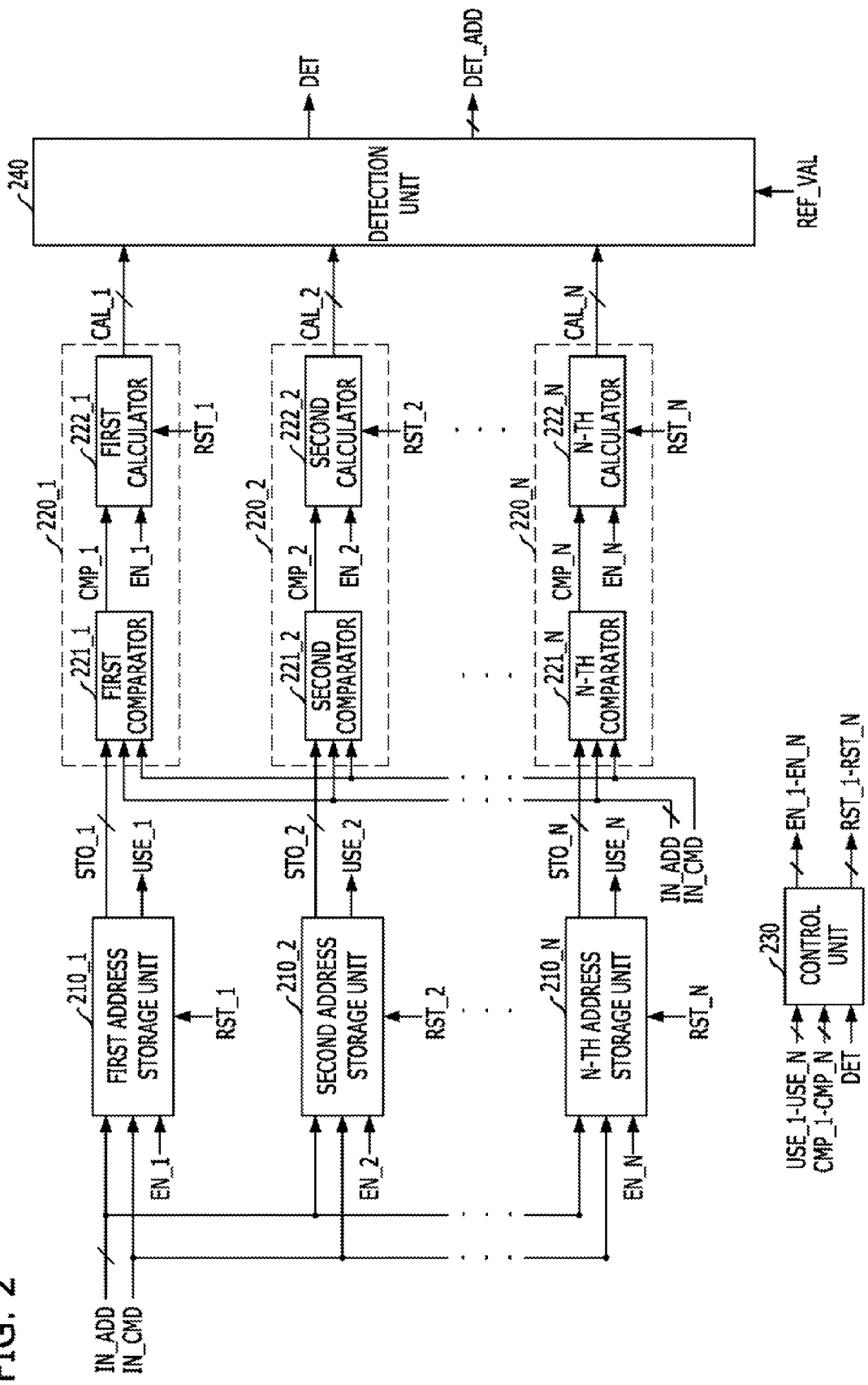
FIG. 2 is a block diagram illustrating an address detection circuit in accordance with an embodiment of the present invention.

FIG. 2 is a block diagram illustrating an address detection circuit in accordance with an embodiment of the present invention.

As illustrated in FIG. 2, the address detection circuit may include first to N-th address storage units 210_1 to 210_N, first to N-th calculation units 220_1 to 220_N, a control unit 230, and a detection unit 240. The address detection circuit may count how many times an address stored in each of the address storage units is inputted with an input command IN_CMD, and detect an address of which the input count number satisfies a set condition.

Each of the first to N-th address storage units 210_1 to 210_N may store one address and output the stored address. The first to N-th address storage units 210_1 to 210_N may generate first to N-th occupation signals USE_1 to USE_N, and may activate the respective occupation signals when an address is stored therein. The first to N-th address storage units 210_1 to 210_N may correspond to first to N-th enable signals EN_1 to EN_N, respectively. Each of the first to N-th address storage units 210_1 to 210_N may store an input address IN_ADD when the input command IN_CMD and the corresponding enable signal are activated.

The first to N-th calculation units 220_1 to 220_N may correspond to the first to N-th address storage units 210_1 to 210_N, respectively. The first to N-th calculation units 220_1 to 220_N may perform a counting operation to generate first to N-th calculated values CAL_1 to CAL_N, respectively, when an address is stored in the respective address storage units or the address stored in the respective address storage units is inputted. Each of the first to N-th calculation units 220_1 to 220_N may increase the calculated value by a unit value, for example, "1", when the enable signal of the corresponding address storage unit is activated. Each of the first to N-th calculation units 220_1 to 220_N may increase the calculated value by the unit value when the input command IN_CMD is activated and an output of the corresponding address storage unit is equal to the input address IN_CMD.

For this operation, the first to N-th calculation units 220_1 to 220_N may include first to N-th comparators 221_1 to 221_N and first to N-th calculators 222_1 to 222_N, respectively. The first to N-th comparators 221_1 to 221_N may generate first to N-th comparison signals CMP_1 to CMP_N, respectively. Each of the first to N-th comparators 221_1 to 221_N may activate the comparison signal when the input command IN_CMD is activated and the output of the corresponding address storage unit is equal to the input address IN_ADD. The first to N-th calculators 222_1 to 222_N may generate the first to N-th calculated values CAL_1 to CAL_N, respectively. Each of the first to N-th calculators 222_1 to 222_N may increase the calculated value when the enable signal of the corresponding address storage unit is activated or the corresponding comparison signal is activated.

The first to N-th address storage units 210_1 to 210_N and the first to N-th calculation units 220_1 to 220_N may receive first to N-th reset signals RST_1 to RST_N, respectively. Each of the first to N-th address storage units 210_1 to 210_N and the first to N-th calculation units 220_1 to 220_N may be reset when the corresponding reset signal is activated.

The control unit 230 may control the input address IN_ADD to be sequentially stored in the first to N-th address storage units 210_1 to 210_N. When all of the first to N-th address storage units 210_1 to 210_N each store an address, the control unit 230 may control the input address IN_ADD to be sequentially stored in a selected address storage unit among the first to N-th address storage units 210_1 to 210_N. The control unit 230 may select an address storage unit to store the input address IN_ADD among the first to N-th address storage units 210_1 to 210_N in response to the input command IN_CMD and activate an enable signal corresponding to the selected address storage unit.

The control unit 230 may select an address storage unit corresponding to a deactivated occupation signal among the first to N-th occupation signals USE_1 to USE_N. The control unit 230 may deactivate the first to N-th enable signals EN_1 to EN_N when any one of the first to N-th comparison signals is activated. When the comparison signal is activated, the input address IN_ADD does not need to be stored in the address storage unit because a stored address is equal to the input address IN_ADD.

When two or more occupation signals of the first to N-th occupation signals USE_1 to USE_N are deactivated, the control unit 230 may select an address storage unit corresponding to a leading occupation signal of the deactivated occupation signals. For example, when the second occupation signal USE_2, the third occupation signal USE_3, and the eighth occupation signals USE_8 are deactivated, the control unit 230 may select the second address storage unit 210_2 corresponding to the second occupation signal USE_2 among the deactivated occupation signals. Thus, when all of the first to N-th occupation signals USE_1 to USE_N are deactivated, the control unit 230 may sequentially select the first to N-th address storage units 210_1 to 210_N. When all of the first to N-th occupation signals USE_1 to USE_N are activated, the control unit 230 may select an address storage unit according to a set condition. The set condition will be described below with reference to FIGS. 3 to 8.

When a detection signal DET is activated, the control unit 230 may initialize an address storage unit and a calculation unit corresponding to an activated comparison signal among the first to N-th comparison signals CMP_1 to CMP_N. When an address storage unit is initialized, it may indicate that an address stored in the address storage unit is erased and a corresponding occupation signal is deactivated. When a calculation unit is initialized, it may indicate that a calculated value is set to an initial value, for example, a value corresponding to "0". The initialized calculation unit may perform a counting operation from the beginning. The control unit 230 generates the first to N-th reset signals RST_1 to RST_N. When the detection signal DET is activated, the control unit 230 may activate a reset signal corresponding to an activated comparison signal.

The detection unit 240 may detect an address, which inputted a reference number of times or more, among the addresses stored in the first to N-th address storage units, based on the first to N-th calculated values CAL_1 to CAL_N output from the first to N-th calculation units. The detection unit 240 may compare the first to N-th calculated value CAL_1 to CAL_N to a reference value REF_VAL, activate the detection value DET when any one of the first to N-th calculated values CAL_1 to CAL_N is equal to or more than the reference value REF_VAL, and output an address stored in an address storage unit corresponding to the calculated value equal to or more than the reference value REF_VAL, as a frequent input address DET_ADD.

The number N of address storage units included in the address detection circuit may be set by dividing the total number of addresses inputted during a set period by the reference number. That is due to the number of addresses, which may be inputted by a number equal to or more than the reference number during the set period is equal to or less than a value obtained by dividing the total input number by the reference number i.e., N≥total input number/reference number. The set period section may differ depending on designer. When the address detection circuit is included in the memory, the set period may indicate a time "tRFC" required for refreshing all of first to N-th word lines included in a cell array of the memory. The reference number may differ depending on designer. When the address detection circuit is included in the memory, the reference number may indicate the number of active-precharge operations of a word line at which an adjacent word line may be affected by word line disturbance during the set period.

For example, when the set period is 64 ms then $10^6$ active-precharge operations may be performed during the set period i.e., the total input number is $10^6$. Furthermore, each of the word lines included in the memory may be designed in such a manner that data of memory cells connected to the word line are not degraded even when an adjacent word line is activated-precharged $1.28 \times 10^5$ times during the set period i.e., the reference number is $1.28 \times 10^5$. Accordingly, the memory may detect a word line at which the number of active-precharge operations is equal to or more than the reference number during the set period, and refresh a word line adjacent to the detected word line. At this time, the number of word lines at which the active-precharge operation may be performed a larger number of times than the reference number during the set period, is equal to or less than a "total input number/reference number". Thus, since the "total input number/reference number" is about 7.8 i.e., $10^6/11.28 \times 10^5$, a maximum of seven frequently activated word lines may occur during the set period. Therefore, seven or eight addresses may be stored to detect all of the frequently activated word lines or target lows, during the set period.

Although the number of inputs is counted only for a maximum eight addresses during the set period, all frequent input addresses may be detected. When a new address is inputted in a state where all of the address storage units each store an address, the new address may be stored in place of an address, which is less likely to become a frequent input address among the addresses at which the number of inputs is being counted. Additionally how many times the stored address is inputted may be counted. The method for selecting an address, which is less likely to become a frequent input address, will be described with reference to FIGS. 3 to 8.

The address detection circuit in accordance with the embodiment of the present invention may minimize the number of address storage units in consideration of the maximum number of frequently activated word lines occurring during the set period. Thus, the circuit area of the address detection circuit may be minimized, and frequent input addresses may be effectively detected.

Figure 3:
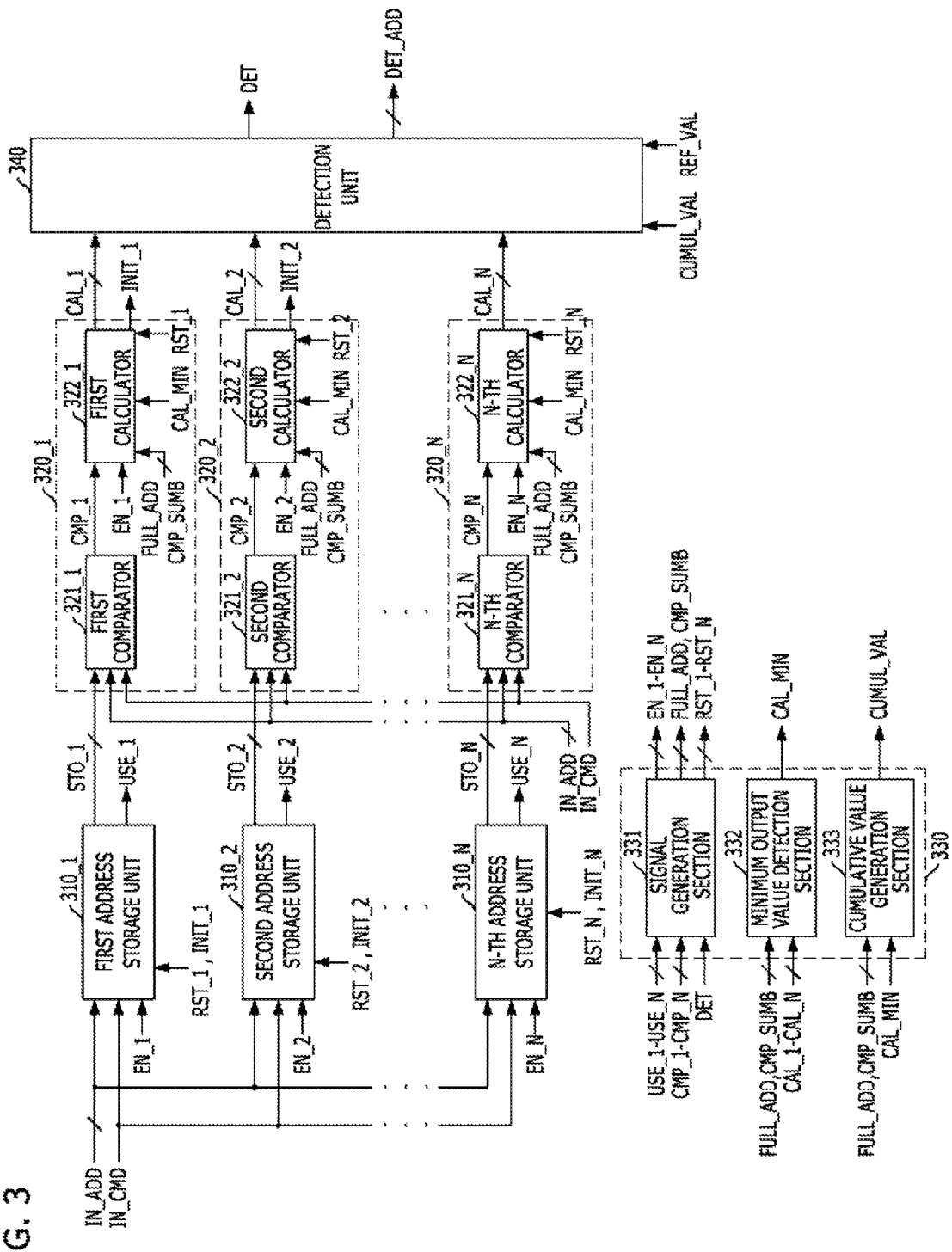
FIG. 3 is a block diagram illustrating an address detection circuit in accordance with an embodiment of the present invention.

FIG. 3 is a block diagram of an address detection circuit in accordance with an embodiment of the present invention.

As illustrated in FIG. 3, the address detection circuit may include first to N-th address storage units 310_1 to 310_N, first to N-th calculation units 320_1 to 320_N, a control unit 330, and a detection unit 340.

The first to N-th address storage units 310_1 to 310_N operate in the same manner as the first to N-th address storage units 210_1 to 210_N shown in FIG. 2. However, each of the first to N-th address storage units 310_1 to 310_N may also erase an address stored therein and deactivate a corresponding occupation signal, when a corresponding initialization signal among first to N-th initialization signals INIT_1 to INIT_N is activated.

The first to N-th calculation units 320_1 to 320_N correspond to the first to N-th address storage units 310_1 to 310_N and may generate first to N-th calculated values CAL_1 to CAL_N respectively, by performing a counting operation in the same manner as the first to N-th calculation units 220_1 to 220_N shown in FIG. 2. The first to N-th calculation units 320_1 to 320_N may generate the first to N-th initialization signals INIT_1 to INIT_N, respectively. When the corresponding calculated value is initialized in a state where an address full signal FULL_ADD is activated, each of the first to N-th calculation units 320_1 to 320_N may activate the initialization signal. When all of the first to N-th address storage units 310_1 to 310_n each stores an address, the first to N-th calculation units 320_1 to 320_N may update the corresponding calculated value a value obtained by subtracting a minimum calculated value CAL_MIN from the corresponding calculated value when an address different from the addresses stored in the first to N-th address storage units 310_1 to 310_N is inputted.

For this operation, the first to N-th calculation units 320_1 to 320_N may include first to N-th comparators 321_1 to 321_N and first to N-th calculators 322_1 to 322_N, respectively. The first to N-th comparators 321_1 to 321_N may generate first to N-th comparison signals CMP_1 to CMP_N, respectively. Each of the first to N-th comparators 321_1 to 321_N may activate a corresponding comparison signal when an output of a corresponding address storage unit is equal to an input address IN_ADD when the input command IN_CMD is activated.

The first to N-th calculators 322_1 to 322_N may generate the first to N-th calculated values CAL_1 to CAL_N, respectively. When a corresponding enable signal is activated or a corresponding comparison signal is activated, each of the first to N-th calculators 322_1 to 322_N may increase the calculated value. Each of the first to N-th calculators 322_1 to 322_N may update the calculated value with a value obtained by subtracting a minimum calculated value CAL_MIN from the calculated value in case where the address full signal FULL_ADD and a sum comparison signal CMP_SUMS are activated.

Each of the first to N-th address storage units 310_1 to 310_N and the first to N-th calculation units 320_1 to 320_N may be reset when a corresponding reset signal is activated.

The control unit 330 may select an address storage unit based on first to N-th occupation signals USE_1 to USE_N, similar to the control unit 220 shown in FIG. 2. The control unit 330 may activate the address full signal FULL_ADD when all of the first to N-th address storage units 310_1 to 310_N each store an address, that is, when all of the first to N-th occupation signals USE_1 to USE_N are activated, and select an address storage unit corresponding to a calculation unit having the smallest output value among the first to N-th calculation units 320_1 to 320_N and when an address different from the addresses stored in the first to N-th address storage units 310_1 to 310_N is inputted. The control unit 330 may activate an enable signal corresponding to the selected address storage unit. The control unit 330 may activate the sum comparison signal CMP_SUMB when all of the first to N-th comparison units CMP_1 to CMP_N are deactivated. When all of the first to N-th address storage units 310_1 to 310_N each store an address, the control unit 330 may generate a cumulative value CUMUL_VAL by accumulating the minimum output value, that is, the minimum calculated value CAL_MIN, whenever an address different from the addresses stored in the first to N-th address storage units 310_1 to 310_N is inputted. The control unit 330 may generate the first to N-th reset signals RST_1 to RST_N. When the detection signal DET is activated, the control unit 330 may activate a reset signal corresponding to an activated comparison signal.

The control unit 330 may include a signal generation section 331, a minimum output value detection section 332, and a cumulative value generation section 333. The signal generation section 331 may activate an enable signal corresponding to a deactivated occupation signal of the first to N-th enable signals EN_1 to EN_N. The signal generation section 331 may activate the sum comparison signal CMP_SUMPB when all of the first to N-th comparison signals CMP_1 to CMP_N are deactivated, and may activate the address full signal FULL_ADD when all of the first to N-th occupation signals USE_1 to USE_N are activated. When two or more occupation signals of the first to N-th occupation signals USE_1 to USE_N are deactivated, the signal generation section 331 may activate an enable signal corresponding to a leading occupation signal among the deactivated occupation signals.

The minimum output value detection section 332 may output the smallest value of the first to N-th calculated values CAL_1 to CAL_N as the minimum calculated value CAL_MIN, when the sum comparison signal CMP_SUMPB and the address full signal FULL_ADD are activated.

The cumulative value generation section 333 may generate the cumulative value CUMUL_VAL by accumulating the minimum calculated value CAL_MIN when the sum comparison signal CMP_SUMB and the address full signal FULL_ADD are activated. The cumulative value CUMUL_VAL may be obtained by accumulating the smallest value of the first to N-th calculated values CAL_1 to CAL_N whenever an address different from the addresses stored in the first to N-th address storage units 310_1 to 310_N is inputted in case where all of the first to N-th address storage units each store an address.

The detection unit 340 may detect an address stored in an address storage unit corresponding to a calculated value at which the sum of the cumulative value CUMUL_VAL and the corresponding calculated value is equal to or more than a reference value REF_VAL, among the first to N-th calculated values CAL_1 to CAL_4. The reference value REF_VAL corresponds to a reference number. The detection unit 340 may compare a value obtained by adding the cumulative value CUMUL_VAL to each of the first to N-th calculated values CAL_1 to CAL_N to the reference value REF_VAL, output a frequent input address DET_ADD stored in an address storage unit corresponding to the value equal to or more than the reference value REF_VAL, and activate the detection signal DET. The value obtained by adding the cumulative value CUMUL_VAL to each of the first to N-th calculated values CAL_1 to CAL_N may be equal to or more than how many times the address stored in the address storage unit is inputted. Thus, an address stored in an address storage unit in which the sum of a corresponding calculated value and the cumulative value is equal to or more than the reference value REF_VAL may include an address, which is inputted the reference number of times or more.

Figure 4:
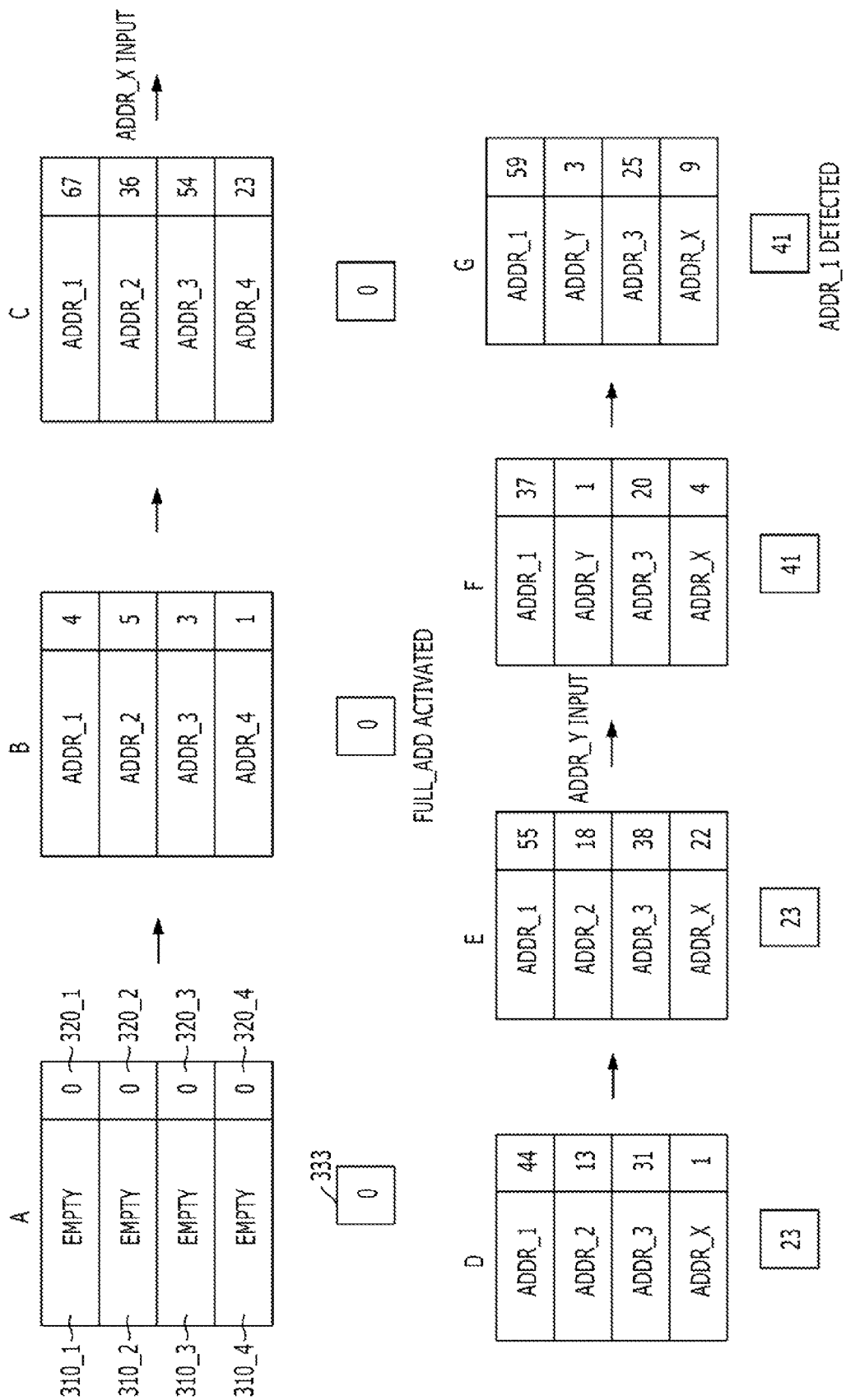
FIG. 4 is a diagram for describing an operation of the address detection circuit shown in FIG. 3.

The number N of address storage units included in the address detection circuit may be equal to or more than a value obtained by dividing the total number of addresses inputted during a set period by the reference number. FIG. 4 is a diagram for describing an operation of the address detection circuit shown in FIG. 3. In the following descriptions, the address detection circuit shown in FIG. 3 includes four address storage units i.e., N=4, and the reference number is 100.

FIG. 4 illustrates a process in which an address is stored in the first to fourth address storage units 310_1 to 310_4 and the first to fourth calculated values CAL_1 to CAL_4 are generated.

Blocks represented by reference numerals 310_1 to 310_4 may indicate the first to fourth address storage units 310_1 to 310_4, respectively. When an address storage unit stores no address, a block corresponding to the address storage unit may be represented by "EMPTY". Blocks represented by reference numerals 320_1 to 320_4 may indicate the first to fourth calculation units 320_1 to 320_4, respectively. Numbers within the blocks indicating the respective calculation units may represent calculated values CAL_1 to CAL_4, respectively. A block represented by reference numeral 333 may indicate the cumulative value generation section 333. A number within the block indicating the cumulative value generation section 333 may represent a cumulative value CUMUL_VAL.

In the initialized state, the first to fourth address storage units 310_1 to 310_4 may store no address, and the first to fourth calculated values CAL_1 to CAL_4 corresponding to the first to fourth calculation units 310_1 to 310_4 may be set to an initial value, for example, "0" in (A).

When an address is inputted, the address is stored as an address ADDR_1 in the first address storage unit 310_1, and the first calculated value CAL_1 is increased by "1". Then, when the same address as the address stored in the first address storage unit 310_1 is inputted, the first calculated value CAL_1 is increased by "1". When an address different from the address ADDR_1 stored in the first address storage unit 310_1 is inputted, the input address is stored as an address ADDR_2 in the second address storage unit 310_2 and the second calculated value CAL_1 is increased by "1". When the same address as each of the addresses ADDR_1 and ADDR_1 stored in the address storage units is inputted, the corresponding calculated value CAL_1 or CAL_2 is increased by "1". When an address different from the addresses ADDR_1 and ADDR_2 stored in the address storage units is inputted, the input address is stored in the next address storage unit 310_3, and the third calculated value CAL_3 is increased by "1".

As such, when the same address as an address stored in an address storage unit is inputted, the address detection circuit increases a corresponding calculated value by "1". Furthermore, when an address different from the address stored in the address storage unit is inputted, the address detection circuit stores the address in the next empty address storage unit. When all of the first to fourth address storage units 310_1 to 310_4 each store an address, the address full signal FULL_ADD is activated (B). When an address ADDR_X different from the addresses stored in the first to fourth address storage units 310_1 to 310_4 is inputted after the address full signal FULL_ADD is activated, the first to fourth calculated values CAL_1 to CAL_4 are updated with values obtained by subtracting a minimum calculated value CAL_MIN from the respective calculated values. For example, when the first to fourth calculated values CAL_1 to CAL_4 are 67, 36, 54, and 23, respectively, the minimum calculated value CAL_MIN corresponds to 23 in (C). When the address ADDR_X different from the addresses ADDR_1 to ADDR_4 is inputted, each of the first to fourth calculation units 320_1 to 320_4 update the corresponding calculated value with a value obtained by subtracting the minimum calculated value CAL_MIN from the calculated value, and the cumulative value generation section 333 generates a cumulative value CUMUL_VAL by accumulating the CAL_MIN. Thus, the first to fourth calculated values CAL_1 to CAL_4 are updated to 44, 13, 31, and 0, respectively, and the cumulative value CUMUL_VAL becomes 23. The fourth address storage unit 310_4 of which the calculated value corresponds to the initial value of "0" is initialized, the control unit 330 selects the fourth address storage unit 310_4 to store the input address i.e., ADDR_X, and the fourth calculated value CAL_4 becomes "1" in (D).

Further, (E) denotes when the first to fourth calculated values CAL_1 to CAL_4 are 55, 18, 38, and 22, respectively, according to the subsequent inputs of the addresses ADDR_1 to ADDR_3, and ADDR_X.

When an address ADDR_Y different from the addresses ADDR_1 to ADDR_3 and ADDR_X is inputted, the minimum calculated value CAL_MIN becomes 18. Thus, the first to fourth calculated values CAL_1 to CAL_4 are updated to 37, 0, 20, and 4, respectively, and the cumulative value CUMUL_VAL becomes 41. The second address storage unit 310_2 is initialized, the control unit 330 selects the second address storage unit 310_2 to store the input address i.e., ADDR_Y, and the second calculated value CAL_2 becomes "1" in (F).

Then, when the addresses corresponding to ADDR_1 ADDR_3, ADDR_X, and ADDR_Y are continuously inputted so that the first calculated value CAL_1 corresponding to the address ADDR_1 becomes 59, the sum of the first calculated value CAL_1 and the cumulative value CUMUL_VAL becomes 100. Thus, the detection unit 340 activates the detection signal DET, and outputs the address ADDR_1 as the frequent input address DET_ADD (G). Then, the first address storage unit 310_1 and the first calculation unit 320_1 are initialized.

The address detection circuit in accordance with the embodiment of the present invention may select an address storage unit and store an input address, when all of the storage units each store an address. Thus, the number of address storage units may be minimized. Therefore, it may be possible to effectively detect frequent input addresses while minimizing the circuit area of the address detection circuit.

Figure 5:
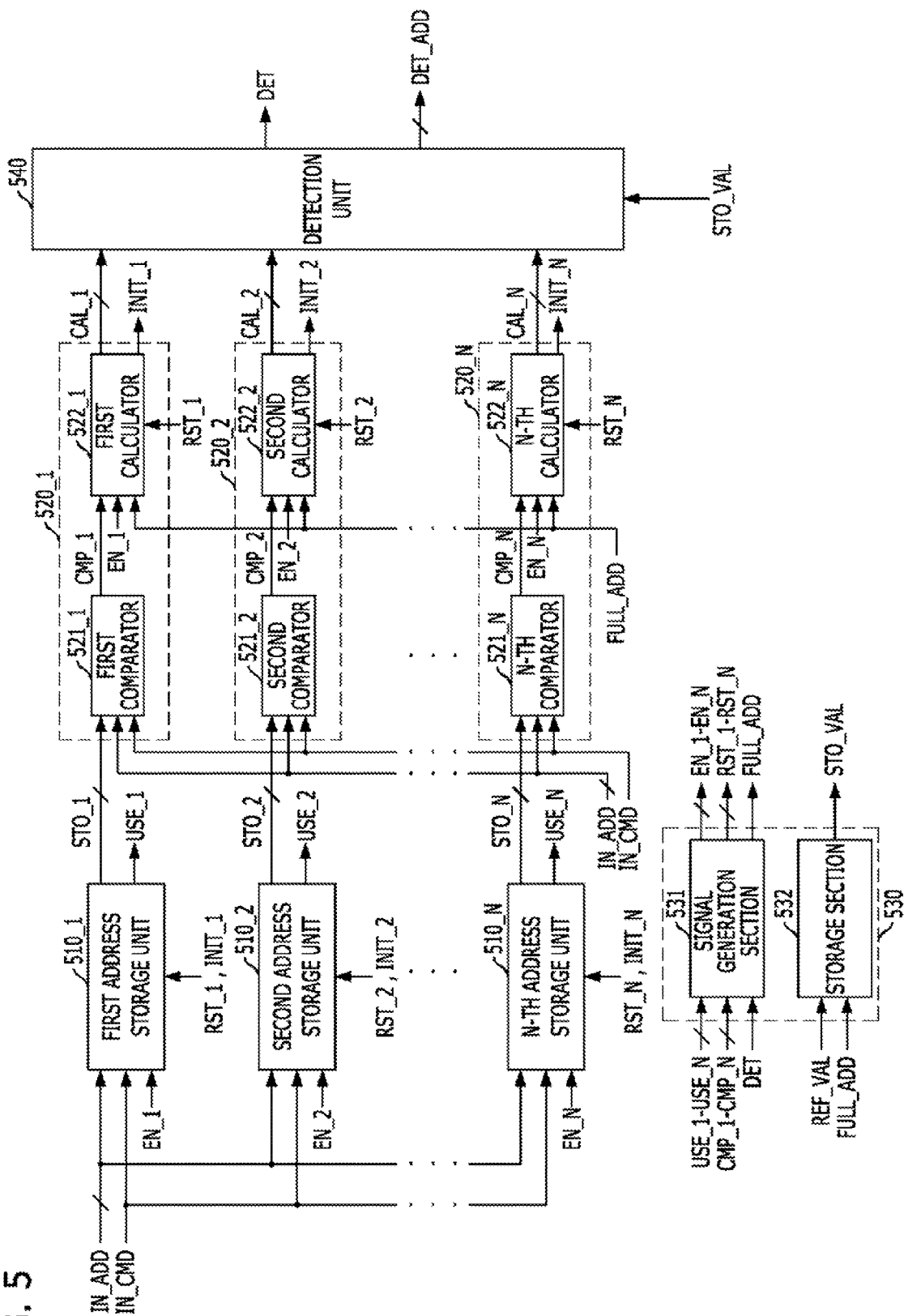
FIG. 5 is a block diagram illustrating an address detection circuit in accordance with an embodiment of the present invention.

FIG. 5 is a block diagram of an address detection circuit in accordance with an embodiment of the present invention.

As illustrated in FIG. 5, the address detection circuit may include first to N-th address storage units 510_1 to 510_N, first to N-th calculation units 520_1 to 520_N, a control unit 530, and a detection unit 540.

The first to N-th address storage units 510_1 to 510_N operate in the same manner as the first to N-th address storage units 210_1 to 210_N shown in FIG. 2. However, each of the first to N-th address storage units 510_1 to 510_N may also erase an address stored therein and deactivate a corresponding occupation signal when a corresponding initialization signal among first to N-th initialization signals INIT_1 to INIT_N is activated.

The first to N-th calculation units 520_1 to 520_N may correspond to the first to N-th address storage units 510_1 to 510_N and generate first to N-th calculated values CAL_1 to CAL_N, respectively, by performing a counting operation in the same manner as the first to N-th calculation units 220_1 to 220_N shown in FIG. 2. The first to N-th calculation units 520_1 to 520_N may generate the first to N-th initialization signals INIT_1 to INIT_N, respectively, and may activate the initialization signals when the calculated values become the initial value when the address full signal FULL_ADD is activated. Each of the first to N-th calculation units 520_1 to 520_N may update the calculated value with a value obtained by subtracting a unit value from the calculated value, when all of the first to N-th address storage units 510_1 to 510_N each store an address. That is, each of the first to N-th calculation units 520_1 to 520_N may subtract one from the calculated value whenever the address full signal FULL_ADD is activated.

For this operation, the first to N-th calculation units 520_1 to 520_N may include first to N-th comparators 521_1 to 521_N and first to N-th calculators 522_1 to 522_N, respectively. The first to N-th comparators 521_1 to 521_N may generate first to N-th comparison signals CMP_1 to CMP_N, respectively. When the input command IN_CMD is activated, each of the first to N-th comparators 521_1 to 521_N may activate a corresponding comparison signal in case where an output of a corresponding address storage unit is equal to the input address IN_ADD.

The first to N-th calculators 522_1 to 522_N may generate the first to N-th calculated values CAL_1 to CAL_N, respectively. When a corresponding enable signal is activated or a corresponding comparison signal is activated, each of the first to N-th calculators 522_1 to 522_N may increase the calculated value. Each of the first to N-th calculators 522_1 to 522_N may decrease the calculated value by one whenever the address full signal FULL_ADD is activated.

Each of the first to N-th address storage units 510_1 to 510_N and the first to N-th calculation units 520_1 to 520_N may be reset when a corresponding reset signal is activated.

The control unit 530 may select an address storage unit based on first to N-th occupation signal's USE_1 to USE_N, similar to the control unit 220 shown in FIG. 2. The control unit 530 may activate the address full signal FULL_ADD when all of the first to N-th address storage units 510_1 to 510_N each store an address, that is, when all of the first to N-th occupation signals USE_1 to USE_N are activated, and select an address storage unit corresponding to a calculation unit of which a calculated value corresponds to an initial value, among the first to N-th address storage units 510_1 to 510_N. The initial value is an output value when the first to N-th calculation units 520_1 to 520_N are initialized, for example, "0". The control unit 530 may activate an enable signal corresponding to the selected address storage unit. The control unit 530 stores a reference value REF_VAL as an initial value corresponding to a reference number, and may update the stored value with a value obtained by subtracting a unit value from the stored value, whenever all of the first to N-th address storage units 510_1 to 510_N each store an address.

The control unit 530 may include a signal generation section 531 and a storage section 532. The signal generation section 531 may activate an enable signal corresponding to a deactivated occupation signal. The signal generation section 531 may activate the address full signal FULL_ADD when all of the first to N-th occupation signals USE_1 to USE_N are activated. When two or more occupation signals among the first to N-th occupation signals USE_1 to USE_N are deactivated, the signal generation section 531 may activate an enable signal corresponding to a leading occupation signal among the deactivated occupation signals. The control unit 530 may generate the first to N-th reset signals. When the detection signal DET is activated, the control unit 530 may activate a reset signal corresponding to an activated comparison signal.

The storage section 532 may store the reference value REF_VAL corresponding to a reference number as an initial value, and update the stored value with a value obtained by subtracting the unit value, for example, "1", from the stored value whenever the address full signal FULL_ADD is activated. The storage section 532 may output the stored value STO_VAL.

The detection unit 540 may detect an address stored in an address storage unit corresponding to a calculated value equal to or more than the stored value STO_VAL outputted from the control unit 530, among the first to N-th calculated values CAL_1 to CAL_N. The detection unit 540 may compare the first to N-th calculated values CAL_1 to CAL_N to the stored value STO_VAL outputted from the control unit 530, output a frequent input address DET_ADD stored in an address storage unit corresponding to a calculated value equal to or more than the stored value STO_VAL, and activate the detection signal DET. The address detection circuit subtracts "1" from the first to N-th calculated values CAL_1 to CAL_N and the initial value stored in the storage section 532 whenever the address full signal FULL_ADD is activated. Thus, the address stored in the address storage unit corresponding to the calculated value equal to more than the stored value STO_VAL may include an address, which is inputted the reference number of times or more.

The number N of address storage units included in the address detection circuit may correspond to a value obtained by dividing the total number of addresses inputted during a set period by the reference number.

Figure 6:
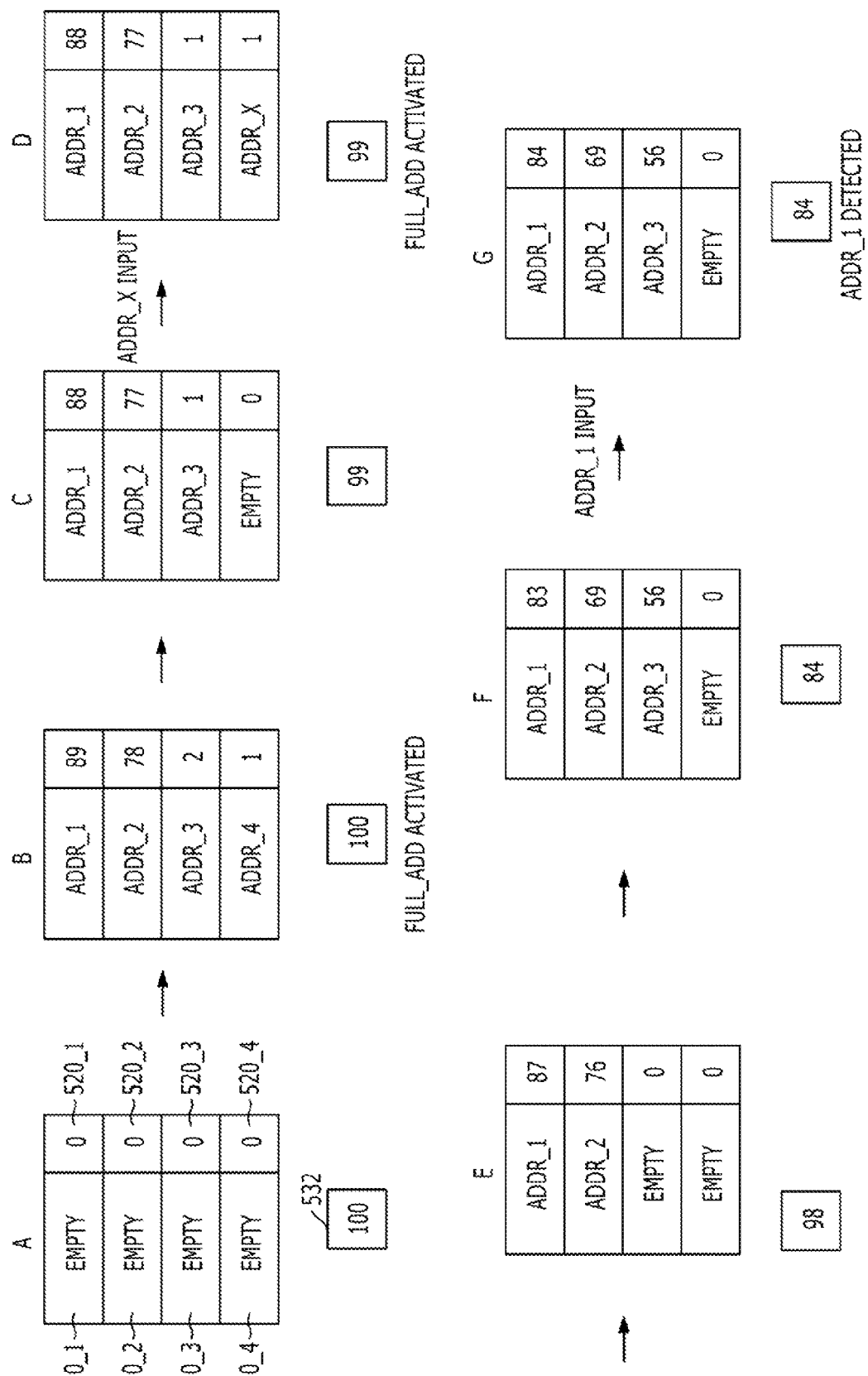
FIG. 6 is a diagram for describing an operation of the address detection circuit shown in FIG. 5.

FIG. 6 is a diagram for describing an operation of the address detection circuit shown in FIG. 5. In the following descriptions, the address detection circuit shown in FIG. 5 includes four address storage units i.e., N=4, and the reference number is 100. FIG. 6 illustrates the process in which an address is stored in the first to fourth address storage units 510_1 to 510_4 and the process in which the first to fourth calculated values CAL_1 to CAL_4 are generated.

Blocks represented by reference numerals 510_1 to 510_4 may indicate the first to fourth address storage units 510_1 to 510_4, respectively. When an address storage unit stores no address, a block corresponding to the address storage unit may be represented by "EMPTY". Blocks represented by reference numerals 520_1 to 520_4 may indicate the first to fourth calculation units 520_1 to 520_4, respectively. Numbers within the blocks indicating the calculation units may represent the calculated values CAL_1 to CAL_4, respectively. A block represented by reference numeral 532 may indicate the storage section 532. A number within the block indicating the storage section 532 may represent the stored value STO_VAL. In the initialized state, the first to fourth address storage units 510_1 to 510_4 store no address, and the first to fourth calculated values CAL_1 to CAL_4 corresponding to the first to fourth calculation units 510_1 to 510_4 may be set to an initial value, for example, "0" in (A).

The process in which addresses are stored in the first to fourth address storage units 510_1 to 510_4 in the initialized state is performed in the same manner as the process in which addresses are stored in the first to third address storage units 310_1 to 310_3 as described above with reference to FIG. 4. Suppose that addresses are stored in the first to third address storage units 510_1 to 510_3, and the first to third calculated values CAL_1 to CAL_3 are 89, 78, and 2, respectively. When an address different from the addresses ADDR1 to ADDR3 is inputted, the input address is stored in the fourth address storage unit 510_4, and the fourth calculated value CAL_4 is counted as 1 in (B). Since all of the first to fourth address storage units each store an address, the address full signal FULL_ADD is activated, the first to fourth calculated values CAL_1 to CAL_4 are updated with 88, 77, 1, and 0, and the fourth address storage unit 510_4 is initialized. The value stored in the storage unit 532 is updated with 99 obtained by subtracting 1 from 100 in (C).

When an address ADDR_X different from the addresses ADDR_1 to ADDR_3 is inputted, the input address is stored in the fourth address storage unit 510_4, and the fourth calculated value CAL_4 is counted as "1" n (D). Since all of the first to fourth address storage units 510_1 to 510_4 each store an address, the address full signal FULL_ADD is activated, the first to fourth calculated values CAL_1 to CAL_4 are updated with 87, 76, 0, and 0, respectively, and the third and fourth address storage units 510_3 and 510_4 are initialized. The value stored in the storage section 531 is updated with 98 obtained by subtracting 1 from 99 in (E). The control unit 530 stores an address inputted to a leading address storage unit among the initialized address storage units.

When the same address as the address ADDR_1 is inputted in a state where the first to fourth calculated values CAL_1 to CAL_4 are 83, 69, 56, and 0, respectively, and the stored value STO_VAL stored in the storage section 532 is 84 in (F), the first calculated value CAL_1 is updated with 84. Since the first calculated value CAL_1 becomes equal to or more than the stored value STO_VAL, the detection unit 540 activates the detection signal DET and outputs the address ADDR_1 as the frequent input address DET_ADD in (G). The first address storage unit 510_1 and the first calculation unit 520_1 are initialized.

The address detection circuit in accordance with the embodiment of the present invention may select an address storage unit and store an input address, when all of the storage units each store an address. Thus, the number of address storage units may be minimized. Therefore, it may be possible to effectively detect a frequent input address while minimizing the circuit area of the address detection circuit.

Figure 7:
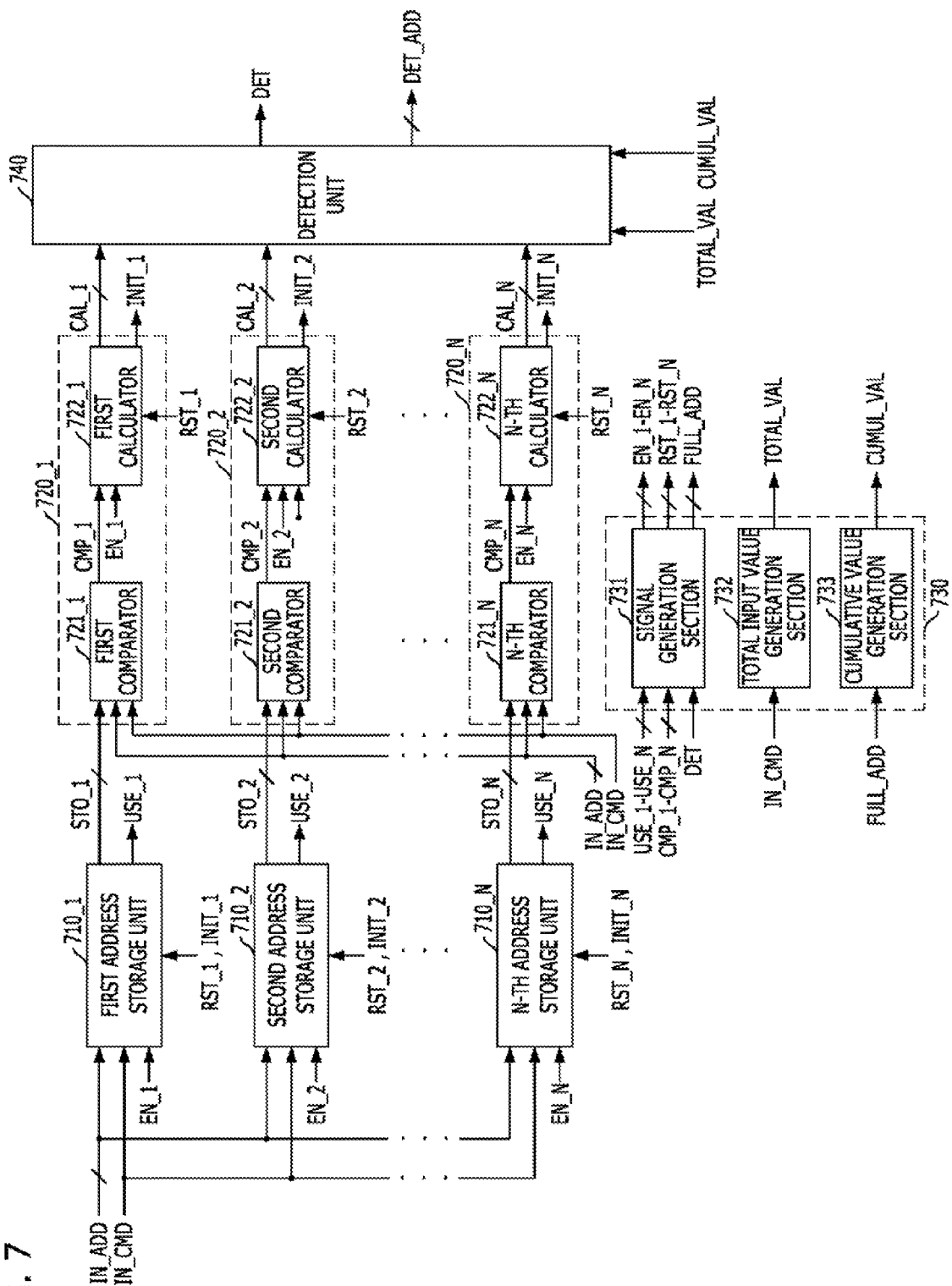
FIG. 7 is a block diagram illustrating an address detection circuit in accordance with an embodiment of the present invention.

FIG. 7 is a block diagram illustrating an address detection circuit in accordance with an embodiment of the present invention.

As illustrated in FIG. 7, the address detection circuit includes first to N-th address storage units 710_1 to 710_N, first to N-th calculated units 720_1 to 720_N a control unit 730, and a detection unit 740.

The first to N-th address storage units 710_1 to 710_N operate in the same manner as the first to N-th address storage units 210_1 to 210_N shown in FIG. 2. However, each of the first to N-th address storage units 710_1 to 710_N may also erase an address stored therein and deactivate a corresponding occupation signal when a corresponding initialization signal among first to N-th initialization signals INIT_1 to INIT_N is activated.

The first to N-th calculation units 720_1 to 720_N have the same configuration and operation as the first to N-th calculation units 520_1 to 520_N of the address detection circuit shown in FIG. 5.

The control unit 730 may select an address storage unit based on first to N-th occupation signals USE_1 to USE_N, similar to the control unit 220 shown in FIG. 2. The control unit 730 may activate the address full signal FULL_ADD when all of the first to N-th address storage units 720_1 to 720_N each store an address, that is, when all of the first to N-th occupation signals USE_1 to USE_N are activated, and select an address storage unit corresponding to a calculation unit having a calculated value corresponding to an initial value among the first to N-th address storage units 720_1 to 720_N. The initial value is an output value when the first to N-th calculation units 720_1 to 720_N are initialized, for example, "0". The control unit 730 may activate an enable signal corresponding to the selected address storage unit. The control unit 730 may count the total number of input addresses, and generate a total input value TOTAL_VAL corresponding to the total number of input address. Furthermore, the control unit 730 may generate a cumulative value CUMUL_VAL by accumulating a unit value whenever all of the first to N-th address storage units 710_1 to 710_N each store an address. The control unit 730 may generate the total input value TOTAL_VAL by performing counting whenever the input command IN_CMD is activated, and may generate the cumulative value CUMUL_VAL by performing counting whenever the address full signal FULL_ADD is activated.

The control unit 730 may generate the first to N-th reset signals RST_1 to RST_N, and activate a reset signal corresponding to an activated comparison signal when the detection signal DET is activated.

The control unit 730 may include a signal generation section 731, a total input value generation section 732, and a cumulative value generation section 733. The signal generation section 731 may operate in the same manner as the signal generation section 531 shown in FIG. 5. The total input value generation section 732 may generate the total input value TOTAL_VAL by counting whenever the input command IN_CMD is activated. The cumulative value generation section 733 may generate the cumulative value CUMUL_VAL by counting whenever the address full signal FULL_ADD is activated.

The detection unit 740 may detect an address stored in an address storage unit corresponding to a calculated value equal to or more than a difference between the cumulative value CUMUL_VAL and a comparison value, which is obtained by dividing the total input value TOTAL_VAL by a set value, among the first to N-th calculated values CAL_1 to CAL_4. For reference, the comparison value may correspond to "total input value TOTAL_VAL/set value−cumulative value CUMUL_VAL". The detection unit 740 may compare the first to N-th calculation values CAL_1 to CAL_4 to the comparison value, output a frequent input address DET_ADD stored in an address storage unit corresponding to a calculated value equal to or more than the comparison value, and activate the detection signal DET. The detection unit 740 may perform a detection operation when the comparison value is equal to or more than an offset value OFFSET_VAL. In FIG. 7, an address, which is inputted a fixed number of times or more may not be detected, but an address, which is inputted a large number of times among the stored addresses may be detected.

The number N of address storage units included in the address detection circuit may be equal to or more than a value obtained by dividing the total number of addresses inputted during a set period by the reference number.

Figure 8:
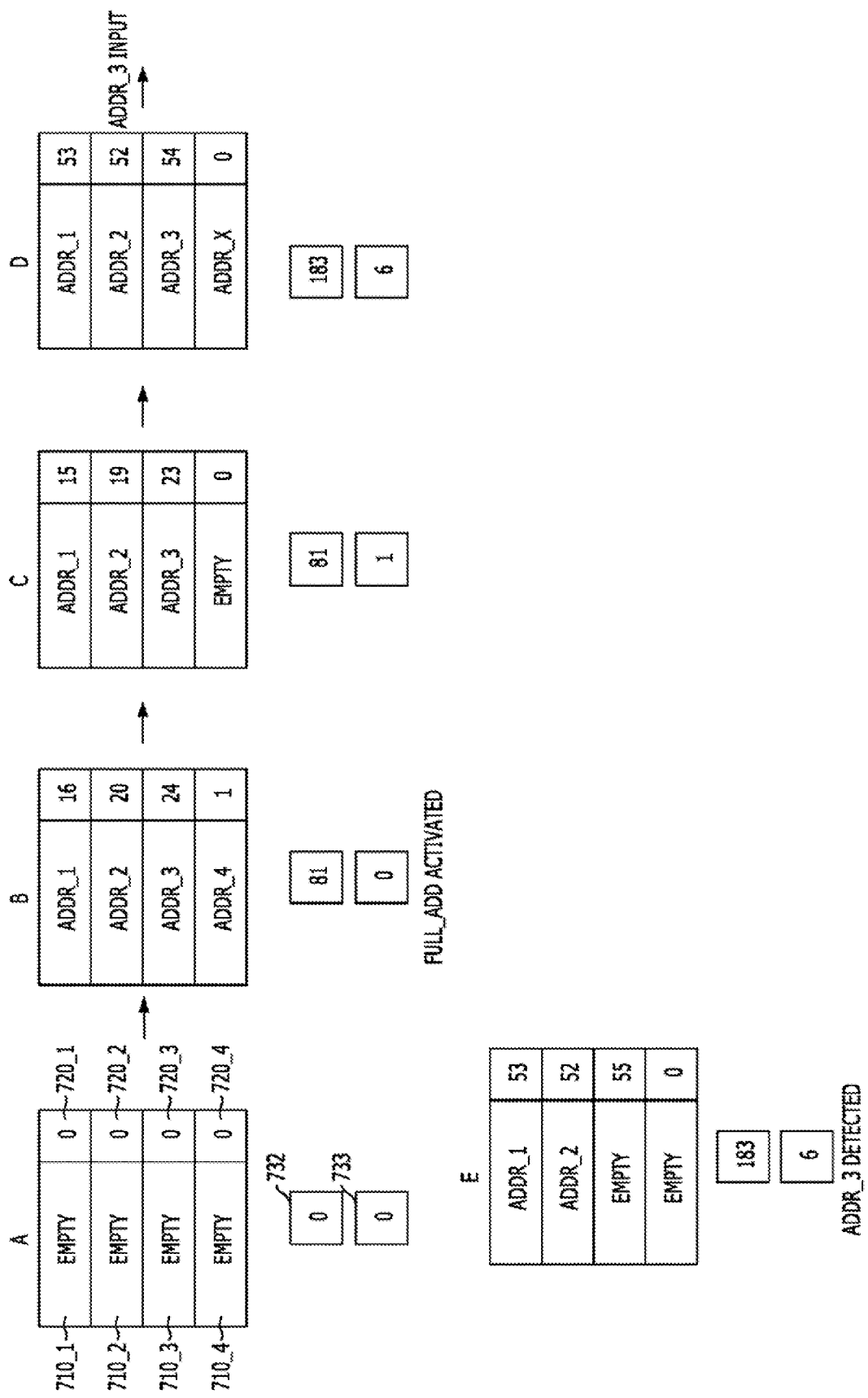
FIG. 8 is a diagram for describing an operation of the address detection circuit shown in FIG. 7.

FIG. 8 is a diagram for describing an operation of the address detection circuit shown in FIG. 7. In the following descriptions, the address detection circuit shown in FIG. 7 includes four address storage units i.e., N=4 the reference number is 100, an offset corresponding to the offset value OFFSET_VAL is 50, and the set value is 3. FIG. 8 illustrates the process in which addresses are stored in the first to fourth address storage units 710_1 to 710_4 and the process in which the first to fourth calculated values CAL_1 to CAL_4 are generated.

Blocks represented by reference numerals 710_1 to 710_4 may indicate the first to fourth address storage units 710_1 to 710_4, respectively. When an address storage unit stores no address, a block corresponding to the address storage unit may be represented by "EMPTY". Blocks represented by reference numerals 720_1 to 720_4 may indicate the first to fourth calculation units 720_1 to 720_4, respectively. Numbers within the blocks indicating the calculation units may represent calculated values CAL_1 to CAL_4, respectively. A block represented by reference numeral 732 may indicate the total input value generation section 732, and a block represented by reference numeral 733 may indicate the cumulative value generation section 733. A number within the block indicating the total input value generation section 732 may represent a total input value TOTAL_VAL, and a number within the block indicating the cumulative value generation section 733 may represent a cumulative value CUMUL_VAL.

In the initialized state, the first to fourth address storage units 710_1 to 710_4 may store no address, and the first to fourth calculated values CAL_1 to CAL_4 corresponding to the first to fourth calculation units 710_1 to 710_4 may be set to an initial value, for example, "0" in (A).

The process in which addresses are stored in the first to fourth address storage units 710_1 to 710_4 in the initialized state is performed in the same manner as the process in which addresses are stored in the first to third addresses storage units 310_1 to 310_3 as described above with reference to FIG. 4.

Suppose that addresses are stored in the first to third address storage units 710_1 to 710_3 and the first to third calculated values CAL_1 to CAL_3 are 16, 20, and 24, respectively i.e., the total input value TOTAL_VAL is 80. When an address ADDR_4 different from the addresses ADDR_1 to ADDR_3 is inputted, the input address is stored in the fourth address storage unit 710_4, and the fourth calculated value CAL_4 is counted as "1" in (B). Since the addresses are stored in the first to fourth address storage units 740_1 to 740_4, the address full signal FULL_ADD is activated, the first to fourth calculated values CAL_1 to CAL_4 are updated with 15, 19, 23, and 0, respectively, and the fourth address storage unit 510_4 is initialized. The total input value TOTAL_VAL is counted as 81, and the cumulative value CUMUL_VAL is counted as "1" in (C). The control unit 530 stores an input address in a leading address storage unit among the initialized address storage units.

When the first to fourth calculated values CAL_1 to CAL_4 are 53, 52, 54, and 0, respectively, and the cumulative value CUMUL_VAL is 6, the comparison value may be set to 5, which is obtained by dividing the total input value TOTAL_VALUE of 183 i.e., 53+52+54+0+*4 by "3" and subtracting the cumulative value CUMUL_VAL from the division result, as in (D). At this time, when an address ADDR_3 is inputted, the detection unit 540 activates the detection signal DET and outputs the address ADD_3 as the frequent input address DET_ADD since the third calculated value CAL_3 became equal to or more than the comparison value of 55 in (E). The address storage unit 710_3 and the calculation unit 520_3 are initialized.

The address detection circuit in accordance with the embodiment of the present invention may select an address storage unit according to a proper condition and store an input address, when all of the storage units each store an address. Thus, the number of address storage units may be minimized.

Therefore, it may be possible to effectively detect a frequent input address while minimizing the circuit area of the address detection circuit.

Figure 9:
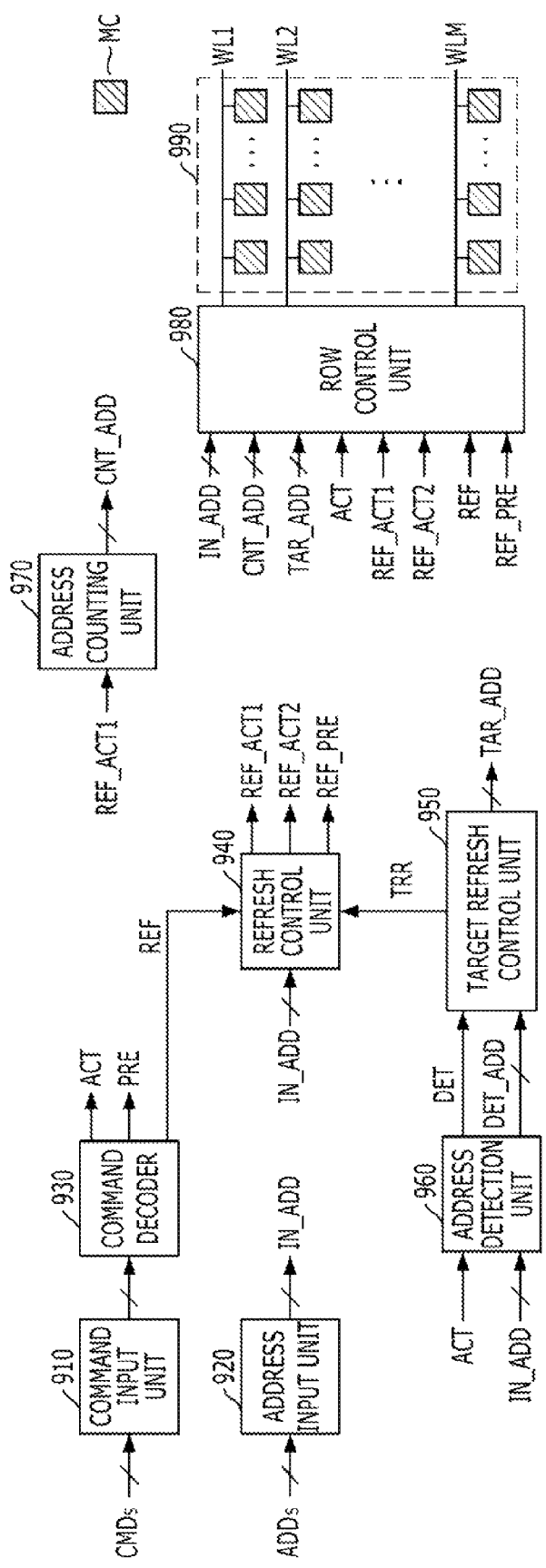
FIG. 9 is a block diagram illustrating a memory in accordance with an embodiment of the present invention.

FIG. 9 is a block diagram illustrating a memory in accordance with an embodiment of the present invention.

Referring to FIG. 9, the memory may include a command input unit 910, an address input unit 920, a command decoder 930, a refresh control unit 940, a target refresh control unit 950, an address detection unit 960, an address counting unit 970, a row control unit 980, and a cell array 990. FIG. 9 illustrates only components related to an active operation and a refresh operation in the memory, and does not illustrate components related to operations that are not directly related to the embodiment of the present invention, such as a read operation and a write operation.

The command input unit 910 may receive commands CMDs applied from a memory controller, and the address input unit 920 may receive addresses ADDs applied from a memory controller. The commands CMDs and the addresses ADDs include multi-bit signals.

The command decoder 930 may decode the command CMDs inputted through the command input unit 210 and generate an active command ACT, a refresh command REF, or a precharge command PRE. When a combination of the input command signals CMDs corresponds to the active command ACT, the command decoder 930 activates the active command ACT, when the combination of the input command signals CMDs corresponds to the refresh command REF, the command decoder 930 activates the refresh command REF, and when the combination of input command signals CMDs corresponds to the precharge command REF, and the command decoder 930 activates the precharge command REF. Additionally, the command decoder 930 may decode the input command signals CMDs to generate a precharge, read, or write command. However, since the precharge, read, and write commands are not directly related to the embodiment of the present invention, the illustration and description thereof are omitted herein.

The refresh control unit 940 may activate a first active signal REF_ACT1 when the refresh command REF is activated, and activate a second active signal REF_ACT2 when a target refresh signal TRR is activated and the refresh command signal REF is activated. The refresh control unit 940 may activate a refresh precharge signal REF_PRE when a set time passes after the first refresh active signal REF_ACT1 or the second refresh active signal REF_ACT2 is activated.

The target refresh control unit 950 may activate the target refresh signal TRR when a detection signal DET is activated, and generate a target address TAR_ADD using a frequent input address DET_ADD outputted from the address detection unit 960. The target address TAR_ADD may include an address corresponding to a word line adjacent to a word line corresponding to the detected frequent input address DET_ADD. The target address TAR_ADD may have a value obtained by adding 1 to the detected frequent input address DET_ADD or subtracting 1 from the detected frequent input address DET_ADD. The target refresh control unit 950 may deactivate the target refresh signal TRR when the refresh command REF is activated a set number of times after the target refresh signal TRR is activated. At this time, the set number of times may be set to two, and the target refresh control unit 950 may sequentially output the value obtained by adding 1 to the detected frequent input address DET_ADD and the value obtained subtracting 1 from the detected frequent input address DET_ADD during a section in which the target refresh signal TRR is activated.

The address detection unit 960 may generate the detection signal DET and the detected frequent input address DET_ADD in response to the active command ACT and the input address IN_ADD. The address detection unit 960 may include an address detection circuit illustrated in one of FIGS. 2, 3, 5, and 7. The active command ACT may correspond to the input command IN_CMD described with reference to FIGS. 2 to 8. The address detection unit 960 may store the input address IN_ADD when the active command ACT is activated, perform a counting operation to activate the detection signal DET according to the method described with reference to FIGS. 2 to 8 when the input address IN_ADD is equal to the stored address, and output the detected frequent input address DET_ADD. Since the detected frequent input address is an address inputted with the active command ACT, the detected word line may include a frequently activated word line.

The address counting unit 970 may perform a counting operation when the first refresh active signal REF_ACT1 is activated, and generate a counting address CNT_ADD using the counting result. When the value of the address is increased by one, it may mean that the address is changed to select a (K+1)-th word line in case where a K-th word line WLK is selected before. The row address unit 980 may sequentially refresh the word lines WL1 to WLM using the counting address CNT_ADD.

The row control unit 980 may activate a word line corresponding to the input address IN_ADD when the active command ACT is activated, activate a word line corresponding to the counting address CNT_ADD when the first refresh active signal REF_ACT1 is activated, and activate a word line corresponding to the target address TAR_ADD when the second refresh active signal REF_ACT2 is activated. The row control unit 980 may precharge the activated word line when the precharge command PRE or the refresh precharge signal REF_PRE is activated.

The cell array 990 may include first to N-th word lines WL1 to WLM and first to N-th word lines each connected to one or more memory cells MC. The word lines WL1 to WLM included in the cell array 990 may be sequentially arranged. In FIG. 9, the bit lines are not illustrated.

When the active command ACT is activated, a word line corresponding to the input address IN_ADD is activated, and a part or all of memory cells MC connected to the activated word line may be accessed i.e., read or written. When the refresh command ACT is activated, a word line corresponding to the counting address CNT_ADD may be activated-precharged. When the word line is activated-precharged, data of the memory cells MC connected to the word line may be refreshed. When the detection signal DET is activated by the address detection unit 960 and the detected frequent input address DET_ADD is outputted, the target refresh signal TRR is activated to perform a target refresh operation. When the target refresh signal TRR is activated and the refresh command REF is activated, a word line corresponding to the target address TAR_ADD may be activated-precharged, that is, refreshed.

The memory in accordance with the embodiment of the present invention may minimize the circuit area of the address detection unit 960, and effectively detect a frequent input address. Furthermore, the memory may perform a target refresh operation using the detected frequent input address, thereby preventing the degradation of data caused by word line disturbance.

Figure 10:
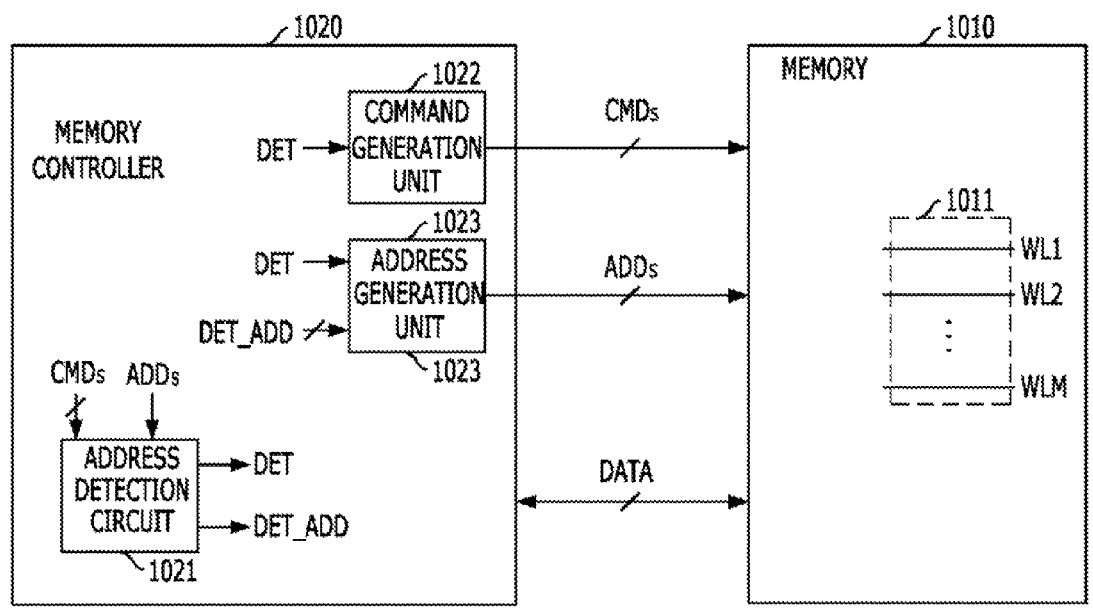
FIG. 10 is a block diagram illustrating a memory system in accordance with an embodiment of the present invention.

FIG. 10 is a block diagram of a memory system in accordance with an embodiment of the present invention.

As illustrated in FIG. 10, the memory system may include a memory 1010 and a memory controller 1020. The memory 1010 may include a cell array 1011 having first to N-th word lines WL1 to WLM. The memory controller 1020 may include an address detection circuit 1021, a command generation unit 1022, and an address generation unit 1023.

The memory controller 1020 may control the operation of the memory 1010 by applying commands CMDs and addresses ADDs to the memory 1010, and exchange data DATA with the memory 1010 during a read or write operation. The memory controller 1020 may transmit the commands CMDs to input a refresh command REF, an active command ACT, or a precharge command PRE to the memory 1010. When the active command ACT is inputted, the memory controller 1020 may transmit the addresses ADDs to the memory 1010 to select a cell array and a word line to activate. When the refresh command REF is inputted, an address CNT_ADD generated inside the memory 1010 or an address STO_ADD stored in the memory 1010 is used. Thus, the memory controller 1020 does not need to transmit the addresses ADDs to the memory 1010.

The memory 1010 may activate a word line corresponding to the input addresses ADDs when the input commands CMDs correspond to the active command ACT, and may read or write data from or to a memory cell connected to the activated word line in response to a read or write command. When read and write commands are applied from the memory controller 1020, the memory 1010 exchanges data DATA with the memory controller 1020. The memory 1010 may precharge an activated word line when the commands CMDs correspond to the precharge command PRE. The memory 1010 may activate-precharge a word line corresponding to a counting address, for example, the counting address CNT_ADD described with reference to FIG. 9, generated inside the memory, when the commands CMDs correspond to the refresh command REF.

The command generation unit 1022 may generate the required commands CMDs and transmit the generated commands CMDs to the memory 1010, and the address generation unit 1023 may generate the required addresses ADDs and transmit the generated addresses ADDs to the memory 1010. The address detection circuit 1021 may receive and store the addresses ADDs when the commands CMDs transmitted to the memory 1010 correspond to the active command ACT, and may generate the detection signal DET and the detected frequent input address DET_ADD based on a result obtained by counting how many times the stored address is transmitted to the memory 1010. The address detection circuit 1021 may correspond to the address detection circuit illustrated in one of FIGS. 2, 3, 5, and 7. The active command ACT may correspond to the input command IN_CMD described with reference to FIGS. 2 to 8. The detected frequent input address may include an address transmitted to the memory 1010 with the active command ACT, the detected word line may include a frequently activated word line.

When the detection signal DET is activated, the memory controller 1020 may control the memory 1010 to enter the target refresh mode. For this operation, the command generation unit 1022 may generate commands (hereafter, referred to as setup commands) for setting the operation mode of the memory 1010, and the address generation unit 1023 may generate addresses for setting the operation mode of the memory 1010 to a target refresh mode. The setup commands CMDs and the addresses ADDs are transmitted to the memory 1010, and the memory 1010 enters the target refresh mode. After the memory 1010 enters the target refresh mode, the command generation unit 1022 may alternately generate the active command and the precharge command three times. The address generation unit 1023 may generate the detected frequent input address DET_ADD and an address corresponding to a word line adjacent to a word line corresponding to the detected frequent input address DET_ADD. For reference, the address of the adjacent word line may have a value obtained by adding one to the detected frequent input address DET_ADD or subtracting one from the detected frequent input address DET_ADD. The generated addresses ADDs may be transmitted to the memory 1010 with the active commands CMDs. The memory 1010 may sequentially activate-precharge the word line corresponding to the detected frequent input address DET_ADD and two word lines adjacent to the word line in response to the transmitted commands CMDs and the transmitted addresses ADDs. When the target refresh operation is completed, the target refresh mode of the memory 1010 may be ended.

FIG. 10 illustrates when the address detection circuit 1021 is included in the memory controller 1020, but the address detection circuit 1021 may included in the memory 1010 depending on design. Therefore, the memory 1010 may transmit the detection signal DET and the detected frequent input address DET_ADD to the memory controller 1020, and perform the target refresh operation according to the control of the memory controller 1020.

The memory system in accordance with the embodiment of the present invention may effectively detect a frequent input address while minimizing the circuit area of the address detection circuit. Furthermore, the memory may perform a target refresh operation using the detected frequent input address, thereby preventing the degradation of data caused by word line disturbance.

In accordance with the embodiments of the present invention, may be possible to minimize the number of addresses required for detecting a frequently activated word lines, thereby minimizing the circuit area of the circuit for detecting a frequently activated word line.

Furthermore, word lines adjacent to a detected word line may be refreshed to prevent the degradation of data caused by word line disturbance.

While the disclosure contains many specifics, these should not be construed as limitations on the scope of any invention or of what may be claimed, but rather as descriptions of features that may be specific to particular embodiments of particular inventions. Certain features that are described in the disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, in some cases one or more features from a claimed combination can be excised from the combination and the claimed combination may be directed to a subcombination or variation of a subcombination. Although operations may be depicted in the drawings in a particular order, this should not be understood as requiring that such operations be performed in the particular order shown or in sequential order, or that all illustrated operations be performed, to achieve desirable results. Moreover, the separation of various system components in the embodiments described in the disclosure should not be understood as requiring such separation in all embodiments.

While the present invention has been described with respect to the specific embodiments, it will be apparent to those skilled in the art that various changes and modifications may be made without departing from the spirit and scope of the invention as defined in the following claims.

What is claimed is:

1. An address detection circuit comprising:
   first to N-th address storage units suitable for storing an address;
   first to N-th calculation units each suitable for performing a counting operation when an address is stored in a corresponding address storage unit among the address storage units or the address stored in the corresponding address storage unit is inputted;
   a control unit suitable for sequentially storing an input address in the address storage units, and storing the input address in an address storage unit corresponding to a calculation unit having the smallest output value among the calculation units in case where all of the address storage units each store an address and an address different from the addresses stored in the address storage units is inputted; and
   a detection unit suitable for detecting an address, which is inputted a reference number of times or more, among the addresses stored in the address storage units, based on outputs of the calculation units.

2. The address detection circuit of claim 1, wherein the address storage units generate first to N-th occupation signals, respectively, and an address storage unit having an address stored therein activates a corresponding occupation signal among the occupation signals.

3. The address detection circuit of claim 1, wherein a calculation unit corresponding to the selected address storage unit among the calculation units is initialized, and the initialized calculation unit counts from an initial value.

4. The address detection circuit of claim 1, wherein N is equal to or more than a value obtained by dividing the total number of addresses inputted during a set period by the reference number.

5. The address detection circuit of claim 1, wherein when all of the address storage units each store an address, each of the calculation units outputs a value obtained by subtracting a minimum output value from an output value thereof in case where an address different from the addresses stored in the address storage units is inputted and the minimum output value is a minimum value among the output values of the calculation units, and
   the control unit generates a cumulative value by accumulating the minimum output value when an address different from the addresses stored in the address storage units is inputted, in case where all of the address storage units each store an address.

6. The address detection circuit of claim 1, wherein the detection unit detects an address stored in an address storage unit corresponding to a calculation unit in which the sum of the cumulative value and the output value is equal to or more than a reference value corresponding to the reference number, among the calculation units.

7. The address detection circuit of claim 1, wherein each of the calculation units outputs a value obtained by subtracting a unit value from the output value thereof, when all of the address storage units each store an address, and
   the control unit subtracts the unit value from a stored value therein, when all of the address storage units each store an address, wherein an initial value of the stored value is a reference value corresponding to the reference number.

8. The address detection circuit of claim 7, wherein the control unit selects an address storage unit corresponding to a calculation unit having an output value equal to an initial value, among the address storage units, where the initial value is an output value when the calculation units are initialized.

9. The address detection circuit of claim 7, wherein the detection unit detects an address stored in an address storage unit corresponding to a calculation unit having an output value equal to or more than the value stored in the control unit, among the calculation units.

10. The address detection circuit of claim 1, wherein the control unit counts the total number of input addresses to generate a total input value corresponding to the total input number, and generates a cumulative value by accumulating a unit value when all of the address storage units each store an address, and
   each of the calculation units outputs a value obtained by subtracting the unit value from the output value thereof, when all of the address storage units each store an address.

11. The address detection circuit of claim 10, wherein the control unit selects an address storage unit corresponding to a calculation unit having an output value equal to an initial value, among the address storage units, where the initial value is an output value when the calculation units are initialized.

12. The address detection circuit of claim 11, wherein the detection unit detects an address stored in an address storage unit corresponding to a calculation unit having an output value equal to or more than a difference between a value obtained by dividing the total input value by a set value and the cumulative value, among the calculation units.

13. A memory comprising:
   first to N-th word lines each connected to one or more memory cells;
   an address detection unit having first to N-th address storage units suitable for sequentially storing an input address in the address storage units during an active operation, generating first to N-th calculated values by performing a counting operation when an address is stored in the address storage units or the stored address is inputted, and storing an input address in a selected address storage unit when all of the address storage units each store an address, and detecting an address, which is inputted a reference number of times or more based on the calculated values; and
   a control unit suitable for sequentially refreshing the word lines in response to a refresh command inputted at a set period, and refreshing one or more word lines adjacent to a word line corresponding to an address detected by the address detection unit in response to the refresh command, when the address is detected by the address detection unit.

14. The memory of claim 13, wherein the memory generates a counting address, which is changed when one of the word lines is refreshed.

15. The memory of claim 14, wherein the control unit activates a word line corresponding to an input address during the active operation, refreshes a word line corresponding to the counting address in response to the refresh command, and refreshes the one or more adjacent word lines in response to the refresh command when the address is detected by the address detection unit.

16. The memory of claim 13, wherein N is equal to or more than a value obtained by dividing the total number of active operations performed during a set period by the reference number.

17. The memory of claim 13, wherein when all of the address storage units each store an address and an address different from the addresses stored in the address storage units is inputted, the address detection unit subtracts a minimum calculated value from the calculated values where the minimum calculated value is the minimum value among the calculated values, generates a cumulative value by accumulating the minimum calculated value, selects an address storage unit corresponding to the smallest calculated value among the calculated values, and
   the address detection unit detects an address stored in an address storage unit in which the sum of a corresponding calculated value and the cumulative value is equal to or more than a reference value corresponding to the reference number, among the address storage units.

18. The memory of claim 13, wherein when all of the address storage units each store an address, the address detection unit subtracts a unit value from the calculated values, subtracts the unit value from a stored value therein, when all of the address storage units each store an address, wherein a initial value of the stored value is a reference value corresponding to the reference number, selects an address storage unit corresponding to a calculated value equal to an initial value among the address storage units, and
   the address detection unit detects an address stored in an address storage unit corresponding to a calculated value equal to or more than the stored value, among the address storage units.

19. The memory of claim 13, wherein the address detection unit generates a total input value corresponding to the total number of input addresses, and
   when all of the address storage units each store an address, the address detection unit subtracts a unit value from the calculated values, generates a reference value obtained by subtracting a cumulative value of the unit value from a value obtained by dividing the total input value by a set value when all of the address storage units each store an address, selects an address storage unit corresponding to a calculated value equal to an initial value among the address storage units, and
   the address detection unit detects an address stored in an address storage unit corresponding to a calculated value equal to or more than the reference value among the address storage units.

* * * * *